Jan. 1, 1974 J. A. FISHER 3,783,052

PROCESS FOR MANUFACTURING INTEGRATED CIRCUITS ON AN ALUMINA SUBSTRATE

Filed Nov. 10, 1972

United States Patent Office 3,783,052
Patented Jan. 1, 1974

1 2

3,783,052

PROCESS FOR MANUFACTURING INTEGRATED CIRCUITS ON AN ALUMINA SUBSTRATE

John A. Fisher, Mesa, Ariz., assignor to Motorola, Inc., Franklin Park, Ill.

Filed Nov. 10, 1972, Ser. No. 305,401
Int. Cl. H01l 7/34
U.S. Cl. 148—191 3 Claims

ABSTRACT OF THE DISCLOSURE

There is disclosed a process for manufacturing integrated circuits, particularly complementary integrated circuits, in a semiconductor material which is deposited upon an insulating aluminum oxide substrate. The process includes the steps of covering the semiconductor material with a masking layer having windows therein and then heating the substrate in a hydrogen atmosphere. The heating step causes an up-diffusion of aluminum into the semiconductor body to form P-type regions underlying the areas exposed to the hydrogen atmosphere through the windows.

BACKGROUND OF THE INVENTION

Figure 1:
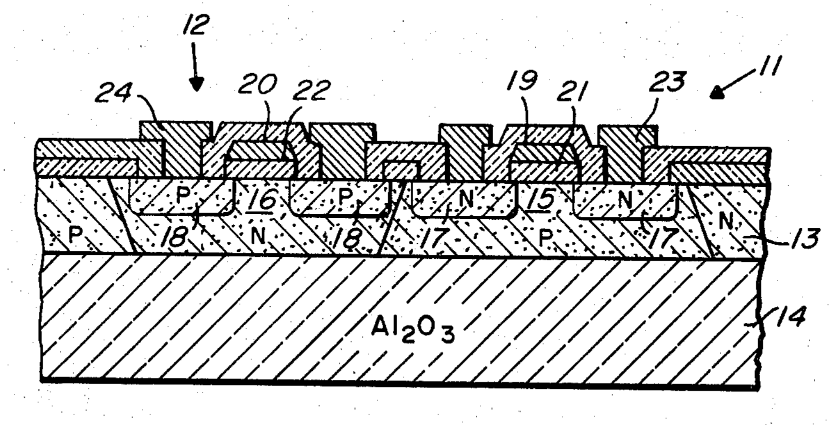

This invention relates to a process for the manufacture of integrated circuits and more particularly to a process for the manufacture of complementary transistor integrated circuits.

Semiconductor integrated circuits can be generally divided into three categories: hybrid, monolithic and dielectrically isolated integrated circuits. In the hydrid form of circuit, semiconductor bars of what might be generally considered to be discrete devices are mounted on an insulating substrate. The insulating substrate generally has some form of thick or thin film circuit pattern thereon to form portions of the interconnection between the bars of semiconductor material. In the monolithic type of integrated circuit, all of the semiconductor components are formed in a single monocrystalline semiconductor material. This type of structure requires some form of electrical isolation betwen the various semiconductor components to prevent parasitic interactions. Where component density is not a particular problem in the manufacture of a circuit of this type, spacing or distance alone may be sufficient to prevent parasitic interaction. However, to attain high density of components it is necessary to provide some form of isolation normally by an isolation diffusion. A dielectrically isolated integrated circuit is somewhat of a combination of the other two types in that it basically approximates a monolithic structure but utilizes a dissimilar insulating material in at least portions thereof to eliminate at least portions of the parasitic electrical characteristics to be avoided. One of these latter types is a so-called "SOS" type of device, "SOS" being an acronym for silicon-on-sapphire or silicon-on-spinel. Sapphire is basically a pure alumina-$Al_2O_3$—while spinel is a magnesium alumina-$Al_2O_3 \cdot MgO$. Some of the original SOS structures were merely a thin silicon semiconductor wafer cemented to a sapphire or spinel substrate while more recently thin films of silicon have been deposited directly on the sapphire or spinel in which semiconductor devices may be manufactured. Whether or not the silicon deposited on the sapphire or spinel is truely monocrystalline rather than polycrystalline is as yet undetermined. Results would show that the thin film of silicon on the sapphire or spinel acts sufficiently like a monocrystalline silicon body to permit the manufacture of good semiconductor devices therein.

The design of various circuits is made less difficult when the use of opposite polarity transistors, i.e., both NPN and PNP type transistors is permitted. This is particularly true with reference to complementary metal oxide semiconductor (CMOS) integrated circuits. In the manufacture of complementary integrated circuits, whether of the monolithic or dielectrically isolated type, regions or "tubs" of the opposite conductivity type must be provided in the basic semiconductor material so that opposite polarity transistors may be manufactured in the basic material and in the tubs by standard diffusion techniques to form both NPN and PNP transistors or, for MOS, both P-channel and N-channel FET's.

SUMMARY OF THE INVENTION

It is an object of this invention to provide an improved process for manufacturing integrated circuits particularly complementary integrated circuits.

It is a further object of this invention to provide a process whereby the regions of opposite conductivity type may be provided in the basic semiconductor material for the formation of complementary integrated circuits.

It is a further object of this invention to provide such a process which is particularly applicable to silicon-on-sapphire or silicon-on-spinel integrated circuits.

In accordance with these objects there is provided a process for manufacturing integrated circuits in a semiconductor material layer supported on an aluminum oxide substrate which process comprises the steps of covering the semiconductor material with a masking layer having windows therein, and thereafter heating the substrate in a hydrogen atmosphere to diffuse aluminum into the semiconductor layer to form P-type regions underlying the windows.

THE DRAWINGS

Figure 2:
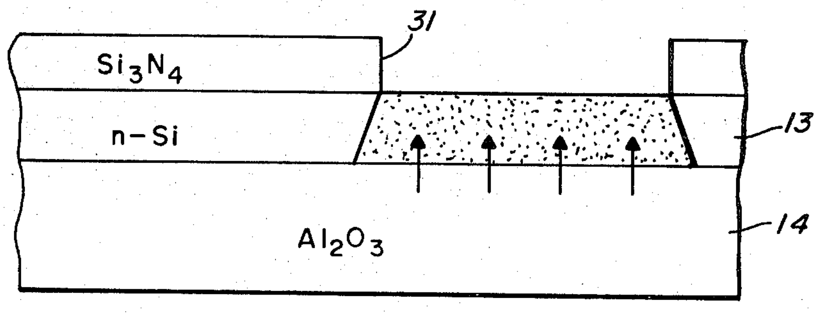

Further objects and advantages of the invention will be apparent from the following complete description and from the drawings wherein:

FIG. 1 is a cross-section of a complementary integrated circuit formed by the process in accordance with the invention; and FIG. 2 is a similar cross-section depicting the processing of the basis semiconductor substrate.

COMPLETE DESCRIPTION

A partial cross-section of a MOS integrated circuit is shown in FIG. 1 and comprises an N-channel MOS device 11 and a P-channel MOS device 12 in an epitaxial layer 13 on a sapphire substrate 14. The MOS transistor 11 is formed in a P-type tub or region 15 while the transistor 12 is formed in an N-type conductivity type tub or region 16. N-type diffusions 17 form source and drain electrodes for the transistor 11 while P-type diffusions 18 form source and drain regions for the transistor 12. Gate electrodes 19 and 20 overlie oxide layers 21 and 22 forming the further structure of the transistors 11 and 12 respectively. Contact members 23 and 24 make ohmic contact to the source and drain regions.

The foregoing integrated circuit structure can be readily manufactured in accordance with the invention as shown in FIG. 2 starting with a substrate 14 of sapphire (aluminum oxide) or spinel (magnesium-aluminum-oxide). An N conductivity epitaxial layer 13 of silicon is deposited on the sapphire substrate. The layer 13 is relatively thin; i.e., 2 or 3 microns. The entire surface of the wafer is then covered with a suitable masking material preferably a silicon nitride ($Si_3N_4$). Those portions of the wafer wherein P-conductivity tubs or regions 15 are desired, windows 31 are opened in the silicon nitride layer utilizing standard photomask and etch techniques. The wafer is then put in a diffusion furnace. The furnace is filled with hydrogen and heated at a temperature of approximately 1200° C. to affect up-diffusion of the aluminum from the spinel or sapphire substrate into those unmasked portions exposed by windows 31. The diffusion takes place in about 1 hour and results in a relatively lightly doped (approximately $1\text{–}2 \times 10^{16}$ atoms/cm.$^3$) P-type regions. The integrated circuit of FIG. 1 may then be formed by suitable masking and diffusion steps utilizing any one of the standard masking or self-aligned silicon techniques. As shown in FIG. 1 the integrated circuit may be formed by forming a dielectric layer on the surface of epitaxial layer 13. A polycrystalline silicon layer is then deposited and etched to form gate electrodes 19 and 20. Utilizing further masking of first one type of transistor and then the other, P- and N-diffusions are made to form the sources and drains while increasing the conductivity of the polycrystalline gates. The circuits are then completed by a further layer of insulating material and suitable metal interconnects.

While the invention has been disclosed by way of the preferred embodiment thereof, it will be appreciated that suitable modifications may be made therein without departing from the spirit and scope of the invention.

What is claimed is:

1. In the process of manufacturing integrated circuits in a semiconductor material layer supported on an aluminum oxide substrate the improvement comprising the steps of:

covering the semiconductor material with a masking layer having windows therein; and heating said substrate in a hydrogen atmosphere to diffuse aluminum into said semiconductor layer to form P-type regions underlying said windows.

2. A process for manufacturing integrated circuits as recited in claim 1 wherein said semiconductor layer is N-type silicon and further including the steps of forming complementary semiconductor devices in the N-type material and P-type region.

3. A process for manufacturing integrated circuits as recited in claim 2 wherein said semiconductor devices are insulated gate field effect transistors formed by diffusing P-type source and drain regions in said N-type material and by diffusing N-type source and drain regions in said P-type regions.

References Cited

UNITED STATES PATENTS

| | | | |
|---|---|---|---|
| 3,481,801 | 12/1969 | Hugle | 148—191 X |
| 3,681,155 | 8/1972 | Elgan et al. | 148—188 |

GEORGE T. OZAKI, Primary Examiner

U.S. Cl. X.R.

148—186, 187; 317—235 R